United States Patent
Schaeffer, III et al.

(10) Patent No.: US 6,743,668 B2
(45) Date of Patent: Jun. 1, 2004

(54) PROCESS FOR FORMING A METAL OXY-NITRIDE DIELECTRIC LAYER BY VARYING THE FLOW RATE OF NITROGEN INTO THE CHAMBER

(75) Inventors: James K. Schaeffer, III, Austin, TX (US); Mark V. Raymond, Austin, TX (US); Bich-Yen Nguyen, Austin, TX (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 10/425,242

(22) Filed: Apr. 29, 2003

(65) Prior Publication Data

US 2003/0205772 A1 Nov. 6, 2003

Related U.S. Application Data

(62) Division of application No. 09/663,919, filed on Sep. 18, 2000, now Pat. No. 6,576,969.

(51) Int. Cl.⁷ .................... H01L 21/285; H01L 21/443
(52) U.S. Cl. .................... 438/216; 438/287; 438/591; 438/769; 438/785
(58) Field of Search ................ 438/216, 287, 438/591, 769, 770, 775, 785, 786

(56) References Cited

U.S. PATENT DOCUMENTS

| | | | |
|---|---|---|---|
| 4,432,035 A | 2/1984 | Hsieh et al. | |
| 4,464,701 A | 8/1984 | Roberts et al. | |
| 5,367,285 A | 11/1994 | Swinehart et al. | |
| 5,876,788 A | 3/1999 | Bronner et al. | |
| 5,891,798 A | 4/1999 | Doyle et al. | |
| 5,918,147 A | 6/1999 | Filipiak et al. | |
| 5,923,056 A | 7/1999 | Lee et al. | |
| 5,937,303 A | 8/1999 | Gardner et al. | |
| 5,961,791 A | 10/1999 | Frisa | |
| 5,963,810 A | 10/1999 | Gardner et al. | |
| 6,013,553 A | 1/2000 | Wallace et al. | |
| 6,020,243 A | 2/2000 | Wallace et al. | |
| 6,291,867 B1 | 9/2001 | Wallace et al. | |
| 6,300,202 B1 * | 10/2001 | Hobbs et al. | 438/287 |

FOREIGN PATENT DOCUMENTS

JP     04-099861     * 3/1992  ........... C23C/14/06

OTHER PUBLICATIONS

Wilk et al., "Stable zirconium silicate gate dielectrics deposited directly on silicon," American Institute of Physics, Applied Physics Letter, vol. 76, No. 1, pp. 112–114 (2000).
Wilk et al., "Hafnium and zirconium silicates for advanced gate dielectrics," American Institute of Physics, Journal of Applied Physics, vol. 87, No. 1, pp. 484–492 (2000).
Wilk et al., "Electrical Properties of Hafnium Silicate Gate Dielectrics Deposited Directly on Silicon," American Institute of Physics, Appl. Phys. Letter, pps. 1–3 (1999).
Collard, "Growth of nitrogen stabilised cubic $ZrO_2$ phase by reactive magnetron sputtering using two reactive gases," Elsevier Science Ltd., pp. 153–157 (1999).

(List continued on next page.)

*Primary Examiner*—Wael Fahmy
*Assistant Examiner*—Anh Duy Mai

(57) ABSTRACT

The invention relates to a semiconductor device and the process of forming a metal oxy-nitride gate dielectric layer or a metal-silicon oxy-nitride gate dielectric layer. The metal oxy-nitride or metal-silicon oxy-nitride dielectric layer comprises at least one of a metal, silicon, oxygen, and nitrogen atoms where the nitrogen to oxygen atomic ratio is at least 1:2. The metal oxy-nitride or metal-silicon oxy-nitride material has a higher dielectric constant in comparison with a silicon dioxide, providing similar or improved electrical characteristics with a thicker thickness. Other benefits include reduced leakage properties, improved thermal stability, and reduced capacitance versus voltage (CV) hysteresis offset.

11 Claims, 3 Drawing Sheets

OTHER PUBLICATIONS

Lee et al., "Ultrathin Hafnium Oxide with Low Leakage and Excellent Reliability for Alternative Gate Dielectric Application," Microelectronics Research Center, University of Texas, Austin (4 pgs.).

Nieh et al., "MOSCAP and MOSFET characteristics using $ZrO_2$ gate dielectric deposited directly on Si," Microelectronics Research Center, University of Texas, Austin (4 pgs.).

Jung et al., "Electrical and Reliabilty Characteristics of an Ultrathin $TaO_xN_y$ Gate Dielectric Prepared by $ND_3$ Annealing of $Ta_2O_5$," IEEE Electron Device Letters, vol. 21, No. 12, Dec. 2000.

\* cited by examiner

PROCESS FOR FORMING A METAL OXY-NITRIDE DIELECTRIC LAYER BY VARYING THE FLOW RATE OF NITROGEN INTO THE CHAMBER

This application is a divisional of application Ser. No. 09/663,919 filed Sep. 18, 2000, now U.S. Pat. No. 6,576, 967.

FIELD OF THE INVENTION

The present invention relates to a method of fabricating a semiconductor structure, and more particularly to a process for forming a metal oxy-nitride dielectric layer.

DESCRIPTION OF RELATED ART

In an effort to make faster transistors, the dimensions of Metal Oxide Semiconductor Field Effect Transistors (MOSFET) have continually scaled down. A thin and critical layer of the MOS transistor is the gate dielectric. Current gate dielectric thicknesses are near 3 nanometers (nm) and are rapidly scaling down to the sub-2 nm regime.

The study of high permittivity gate dielectrics for its application in Complimentary Metal Oxide Semiconductor (CMOS) technologies has recently intensified. The increased interest in high permittivity gate dielectrics is due to the semiconductor industry's realization that conventional silicon dioxide ($SiO_2$) gate dielectrics will not meet the gate leakage requirements when the dielectric thickness is in the sub-2 nm regime. Within this regime, the gate dielectric is about 13 atoms thick and results in gate leakage currents that exceed industry specifications for low power consumption products.

A solution to the problem of gate leakage currents as the dimensions of MOSFET continue to scale down, is to manufacture MOS transistors using gate dielectrics with permittivities higher than $SiO_2$, such as metal oxide materials. With high permittivity gate dielectrics, the overall dielectric thickness is increased, thus reducing a direct tunneling effect without sacrificing gate capacitance. Unfortunately, there are many issues associated with the integration of metal oxide dielectrics into CMOS technologies. For example, metal oxide dielectrics have worse gate leakage properties than $SiO_2$ films of equivalent physical thickness. In addition, metal oxide dielectrics exhibit poor thermal stability. In standard CMOS integration techniques, the gate dielectric is subjected to subsequent high temperature annealing (>1000 C.) for the source and drain dopant activation. During the source and drain anneals, the metal oxide dielectric reacts with the silicon substrate forming an undesirable $SiO_2$ interfacial region between the silicon and the metal oxide dielectric.

Other thermal stability issues involve film microstructure. Annealing at such extreme temperatures can cause amorphous metal oxide dielectric films to crystallize. This phase transition roughens the dielectric surface, causing increased trapping density and leakage via grain boundaries. The phase transition also increases the propensity for boron diffusion from the gate electrode to the substrate. Boron penetration through the gate dielectric into the substrate results in high threshold voltage shifts and reliability problems.

Further, the metal oxide dielectrics frequently exhibit capacitive hysteresis as indicated by a capacitance versus voltage graph of the metal oxide dielectric layer. The hysteresis is an undesirable trait indicating instability in the threshold voltage and lack of control over the channel region by the gate voltage.

BRIEF DESCRIPTION OF THE DRAWINGS

The present invention is illustrated by way of example and not limitation in the accompanying figures, in which like references indicate similar elements, and in which.

Skilled artisans appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

DETAILED DESCRIPTION OF SPECIFIC EMBODIMENTS

The invention provides methods of forming a gate dielectric layer with the benefits of good film quality and electrical properties. The nitrogen concentration is controllable during the deposition process to determine the amount of reactive species incorporated into the gate dielectric layer. The controllability of the atomic gas flow rate for a reactive species or the controllability of the atomic gas flow rate ratio of more than two reactive species results in a gate dielectric layer having multiple layers. Further, one layer may contain more of a species than the other layers. The invention may also be applied in a device structure such as a transistor or in a more complicated device like a thin film transistor.

Figure 1:
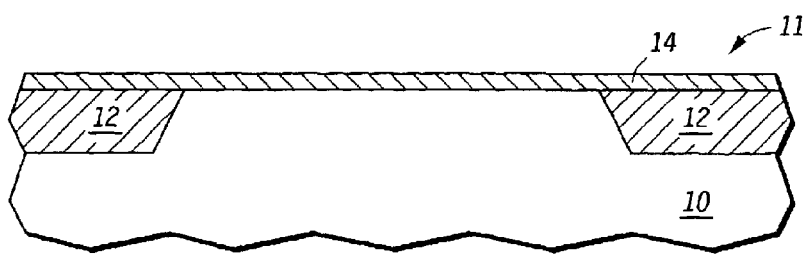
FIG. 1 is a cross-section view illustrating a semiconductor structure according to an embodiment of the invention.

FIG. 1 is a cross-section view illustrating a semiconductor structure 11 that includes a gate dielectric layer 14 and is implemented according to an embodiment of the invention. The semiconductor structure 11 comprises a semiconductor region 10, a field isolation region 12, and the gate dielectric layer 14. For this particular embodiment, the semiconductor region 10 is a semiconductor device substrate of silicon or a semiconductor wafer. In another embodiment, the semiconductor region is a surface of a polycrystalline silicon (polysilicon) layer. The gate dielectric layer 14 is in direct contact with the semiconductor region 10 and contains at least one of a first metal, nitrogen, and oxygen atoms to form a metal oxy-nitride dielectric layer. The gate dielectric layer 14 can further include at least one silicon atom to form a metal-silicon oxy-nitride dielectric layer. The general formula of the gate dielectric layer 14 includes $M_a Si_b O_c N_d$, where M indicates first metal atoms selected from one of Group II elements, Group III elements or Group V elements from the periodic table of the elements. The values of 'a', 'b', 'c', and 'd' indicate the ratio of atoms with respect to the elements in the gate dielectric layer 14. For this particular case, the value of 'a' is greater than 0, both 'b' and 'c' are greater than or equal to 0 but less than 1, and the value of 'd' is greater than 0 and less than 1. Further, the sum of a+b+c+d is equal to 1.

The first metal atoms may contain one or a combination of the following elements: hafnium, zirconium, lanthanum, yttrium, tantalum, aluminum, strontium, barium, titanium, niobium, magnesium, and cerium. In the case where the gate dielectric layer 14 includes two different metal atoms, the second metal atoms are different from the first metal atoms. The nitrogen content of the gate dielectric layer 14 is at least 0.01 atomic percent. In another embodiment, the gate dielectric layer 14 includes three portions having a first portion, a second portion, and a third portion. The first portion contacts the semiconductor region 10 and the second portion lies between the first and third portions. More particularly, the first and third portions contain metal, silicon, nitrogen, and oxygen atoms, while the second portion includes metal, nitrogen, and oxygen atoms having a substantially lower atomic silicon content compared to the first and third portions. The thickness of the gate dielectric layer 14 may vary depending on the device requirements and the application. For this particular embodiment, the gate dielectric layer 14 has a thickness of at least 2 nanometers (nm).

The process for forming the gate dielectric layer 14 utilizes physical vapor deposition (PVD) techniques such as using a sputtering chamber and a sputtering target. In an exemplary chamber capable of performing a PVD process, a semiconductor wafer is positioned opposite to the sputtering target that is mounted to a conductive backing plate. The sputtering target comprises a metal or any combination of one or more of metal, silicon, oxygen, or nitrogen atoms. One or more gases are introduced into the chamber between the sputtering target and the wafer. The gas or gases become ionized creating a plasma and bombards the sputtering target, knocking off metal or silicon species that are then deposited onto the semiconductor wafer to form the gate dielectric layer 14. The gas or gases include at least one inert gas, such as argon. Depending upon the composition of the sputtering target, the gases may further comprise one or any combination of reactive gases including oxygen, nitrogen, $N_2O$ and $NH_3$, etc.

An exemplary process of depositing a gate dielectric layer 14 using a PVD technique first involves preparing a substrate including the semiconductor region 10. The substrate surface is cleaned to either leave behind a native oxide or a hydrogenated surface. By way of example, heating the substrate at a high temperature de-absorbs the hydrogen atoms on the surface. The cleaned substrate is then ready for a PVD process and placed in a chamber or, more specifically, a sputtering chamber. A heating source is employed to achieve and maintain an elevated temperature to the substrate. In one embodiment, a resistive heater applies a sufficient amount of heat to a pedestal connected to a wafer chuck where the substrate sits. The wafer chuck, for example, is heated to a temperature within the range of approximately 200 to 500 degrees Celsius. The pressure, using the PVD technique, is low compared to other deposition methods such as a Low Pressure Chemical Vapor Deposition (LPCVD) process. In one embodiment, a pressure within the range of approximately 2 to 50 mtorr is used.

Power is important to ionize the reactive and inert gases, which in turn effects the sputtering deposition rate. A power source, such as a radio frequency (RF) power generator, a direct current (DC) power generator, or a pulsed direct current (PDC), is employed to sustain a sufficient amount of power to ionize the inert and reactive gases. The power is comparatively lower than typical thin film sputter deposi-tions to obtain a low deposition rate. The deposition rate is within the range of approximately 0.05 to 0.2 nm per seconds.

The sputtering technique allows more controllability in determining the amount of reactive species incorporated into the gate dielectric layer 14. By way of example, nitrogen atoms flow into the sputtering chamber at a first nitrogen atomic flow rate for a first time period. The nitrogen atoms then flow at a second nitrogen atomic flow rate for a second time period after the first time period. The second nitrogen atomic flow rate is substantially different from the first nitrogen atomic flow rate. In one embodiment, the first nitrogen atomic flow rate is higher than the second nitrogen atomic flow rate. In another embodiment, the process of depositing a gate dielectric layer 14 further includes flowing oxygen atoms. In this case, the reactive gases in the exemplary embodiment comprise an atomic ratio of nitrogen-to-oxygen. For example, the nitrogen-to-oxygen atomic ratio is at least 1:2 during the second time period. In particular, the nitrogen and oxygen gases each flow at a rate within the range of 0 to 10 standard cubic centimeters per minute (sccm). The argon gas flows at a rate within 30 to 150 sccm.

It is noted that the gate dielectric layer 14 contacts the semiconductor region 10. In the prior art, the oxygen species in a metal oxide gate dielectric layer reacts with the semiconductor substrate to form an undesirable interfacial silicon dioxide layer. The concentration of the nitrogen and oxygen atoms, according to an embodiment of the present invention, is capable of varying over the deposition time or over the film thickness to improve the characteristics of the semiconductor structure 11. By way of example, the concentration of nitrogen close to the semiconductor wafer interface is increased. As the deposition continues, the influx of oxygen is increased creating a concentration gradient of the gate dielectric layer 14. The lower oxygen ($O_2$) partial pressure close to the semiconductor wafer interface helps in suppressing the interfacial oxide formation typically seen with metal oxide gate dielectric layers.

The concentration gradient of the gate dielectric layer 14 may have any desired characteristic. For example, the concentration gradient may be gradual in which the level of oxygen gas is increased at a controlled rate in time to form a gradual concentration gradient. Alternatively, the ratio may be abruptly modified at any point in time causing a corresponding multi-layer film in the gate dielectric layer 14. The multi-layer film is a result of abrupt changes in composition of nitrogen versus oxygen.

Further, in an exemplary embodiment, the process of forming the gate dielectric layer 14 may include forming a first portion during a first time period, a second portion during a second time period, and a third portion during a third time period. In this example, the first portion contacts the semiconductor region 10 and the second portion lies between the first and third portions. The first and third portions include metal, silicon, nitrogen, and oxygen atoms, and the second portion includes metal, nitrogen, and oxygen atoms having a substantially lower atomic silicon content compared to the first and third portion. In another embodiment, a conductive layer having a semi conductive element may be further included, contacting the third portion of the gate dielectric layer 14.

Figure 2:
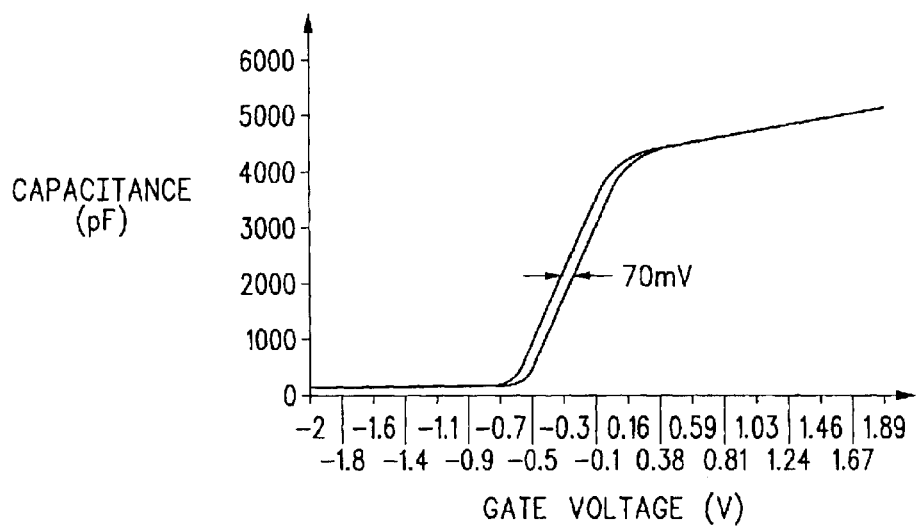
FIG. 2 and FIG. 3 are graph diagrams plotting the capacitance versus voltage (CV sweep) across the gate dielectric layer of FIG. 1, further illustrating the reduction of the hysteresis in the CV sweep with a changing reactant gas ratio.
Figure 3:
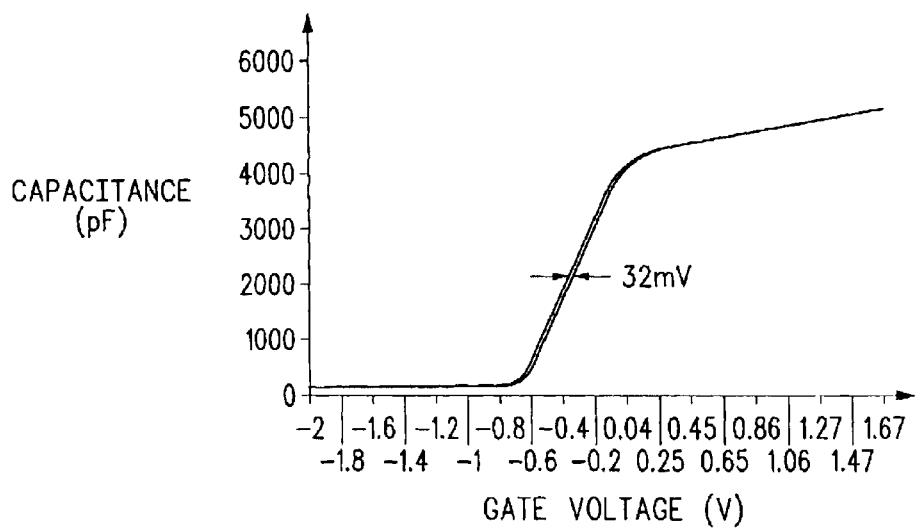

FIG. 2 and FIG. 3 are graph diagrams plotting the capacitance versus the voltage (CV sweep) across the gate dielectric layer 14 of FIG. 1, further illustrating the reduction of the hysteresis in the CV sweep. In general, a varying voltage is applied across the gate dielectric layer 14 and a corresponding capacitance across the layer is measured. In the embodiment shown, the direct current (DC) voltage ranges from −2 to 2 volts and includes an AC component for purposes of measuring the capacitance. In FIG. 2, the gate dielectric layer 14 is a film created using a particular gas ratio of nitrogen-to-oxygen such as a ratio of approximately 1:1. In FIG. 3, the gate dielectric layer 14 was created using a higher ratio of nitrogen-to-oxygen where all other variables, such as pressure, power, etc., were kept constant. The CV hysteresis offset is no greater than approximately 70 milli volts as shown in FIG. 2. When the nitrogen-to-oxygen ratio is increased, however, the CV hysteresis offset reduces to approximately 30 milli volts. In this matter, the reduced CV hysteresis indicates stability in the flatband or threshold voltage shift caused by the excess trapping in the gate dielectric.

Figure 4:
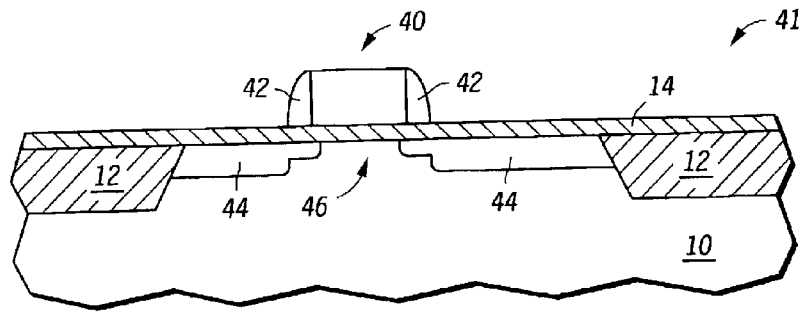
FIG. 4 is a cross-section view illustrating a semiconductor device similar to that shown in FIG. 1, further including a gate electrode.

FIG. 4 illustrates a cross-sectional view of a semiconductor device 41 implemented according to an embodiment of the invention. An example of the semiconductor device 41 is a transistor. For this particular embodiment, the semiconductor device 41 comprises the semiconductor structure 11 of FIG. 1, further including a gate electrode (conductor) 40 overlying the gate dielectric layer 14. Adjacent to the gate electrode 40, are two gate spacers 42. Within the semiconductor region 10, there are two (a first and a second) doped regions 44. The two doped regions 44 may be a source region, a drain region, or a source and drain region. Underlying the gate electrode 40 and the gate dielectric layer 14, is a channel region 46 placed between the first and second doped regions 44.

The variations and different embodiments of the gate dielectric layer 14 of FIG. 1 are applicable in the semiconductor device 41. For this particular embodiment, the thickness of the gate dielectric layer 14 is also no greater than approximately 10 nm. As described in FIG. 1, the gate dielectric layer 14 includes at least one of a first metal, nitrogen, and oxygen atoms to form a metal oxy-nitride layer. The first metal is an element selected from one of Group II elements, Group III elements, or Group V elements from the periodic table of the elements. In another embodiment, the gate dielectric layer 14 further includes at least one silicon atom to create a metal-silicon oxy-nitride layer. The atomic ratio of the nitrogen and oxygen atoms may also vary to create a multi-layered gate dielectric layer 14. For example, the gate dielectric layer 14 in one embodiment comprises three portions, where a first portion contacts the channel region 46 and a second portion lies between the first portion and a third portion. Similar to an embodiment described for the gate dielectric layer 14 of FIG. 1, the second portion has a substantially lower atomic silicon content compared to the first and third portions.

The gate electrode 40, contacting the gate dielectric layer 14, includes a conductive material or a semi conductive element. Typically, the material of the gate electrode is polysilicon and commonly used by those skilled in the art. In one embodiment, the gate electrode 40 includes more than one layer. For example, the gate electrode 40 may include second metal atoms that are different from the first metal atoms, and contact the gate dielectric layer 14. The width of the gate electrode 40 may vary depending on the device specifications and requirements. For this particular embodiment, the width of the gate electrode 40 is no greater than approximately 95 nm.

Figure 5:
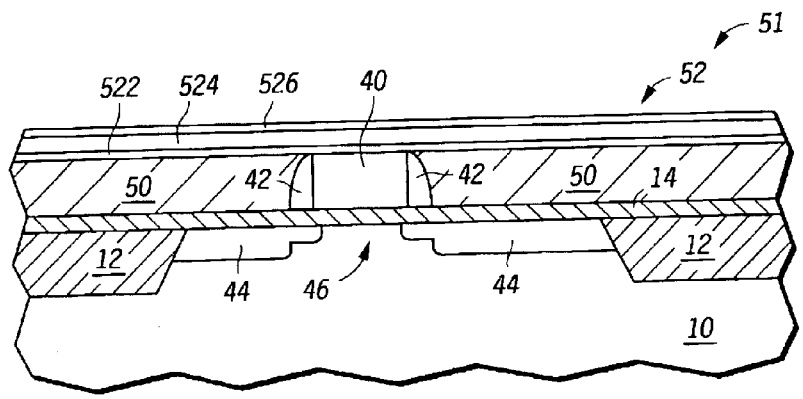
FIG. 5 is a cross-section view illustrating the semiconductor device similar to FIG. 4 further including a second dielectric layer.

FIG. 5 illustrates a cross-section view of another embodiment of the invention implemented in a semiconductor device 51. The semiconductor device 51 further includes the semiconductor device 41 and a second gate dielectric layer 52. An insulating layer 50 is deposited over the gate electrode 40, the two gate spacers 42, and the gate dielectric layer 14. The insulating layer 50 is polished and planarized, stopping at a level equivalent with the top of the gate electrode 40. The second gate dielectric layer 52, is then deposited over the insulating layer 50. The second gate dielectric layer 52 is capable of encompassing the variations and different embodiments described for the gate dielectric layer 14 of FIG. 1 and FIG. 4. For this particular embodiment, the second gate dielectric layer 52 includes a silicate layer 522, a nonsilicate layer 524, and another silicate layer 526.

Figure 6:
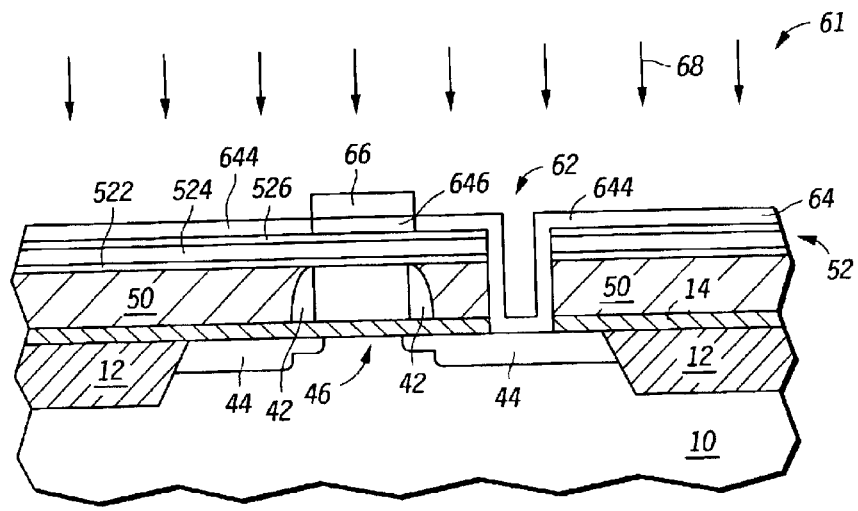
FIG. 6 is a cross-section view illustrating a thin film transistor.

FIG. 6 illustrates a cross-section view of a thin film transistor (TFT) 61. The TFT 61 comprises the semiconductor device 51 of FIG. 5, further including a contact opening 62, a thin layer of conducting materials 64, and an implant mask 66. The material of the implant mask 66 is capable of blocking reactive species. An example of an implant mask 66 is a polymeric photoresist. The contact opening 62 is created by etching through the second gate dielectric layer 52, the insulating layer 50, and the first gate dielectric layer 14. After creating the contact opening 62, a conducting material 64 is deposited onto the semiconductor wafer or substrate comprising the semiconductor region 10 and subsequent layers of the semiconductor device 51 in FIG. 5. In one embodiment, the conducting material 64 includes an element from the Group IV elements in the periodic table of the elements. The implant mask 66 placed onto the conducting material 64 is positioned slightly offset from the gate electrode 40. An implant 68 creates doped regions 644. The channel region 646 is located between the doped regions 644 and underlying the implant mask 66.

Figure 7:
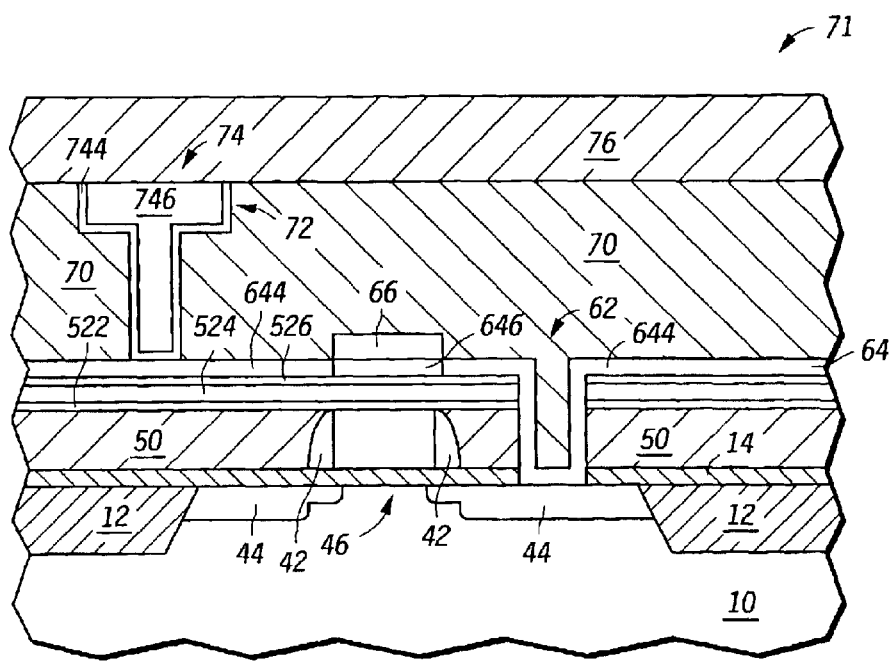
FIG. 7 is a cross-section view of the thin film transistor further comprising an inter-level dielectric layer, a conductive structure and a passivation layer.

FIG. 7 illustrates a cross-section view of a complete semiconductor device 71. The semiconductor device 71 includes the semiconductor device 61 of FIG. 6 and an interlevel dielectric layer 70, a conductive structure 74, and a passivation layer 76. After creating the doped regions 644 and the channel region 646, an interlevel dielectric layer 70 is deposited upon the semiconductor device 61 of FIG. 6. A dual inlaid opening 72 is created by etching a portion of the interlevel dielectric layer 70. A thin barrier layer 744 is deposited within the dual inlaid opening 72, which is then filled with a conductive material 746 creating the conductive structure 74. An example of the conductive material 746 is copper. In this case, the copper material is polished back to the surface of the interlevel dielectric layer 70. Accordingly, the passivation layer 76 is deposited onto the interdielectric layer 70.

The metal oxy-nitride or a metal-silicon oxy-nitride gate dielectric layer as described in the various embodiments according to the invention can benefit for a number of reasons. For example, the process of forming the gate dielectric layer provide reduced leakage properties and improved thermal stability in the metal oxy-nitride or metal-silicon oxy-nitride film. Further, the dielectric constant is increased allowing more flexibility for scaling the thickness of the dielectric layer. Due to the controllability of the atomic nitrogen concentration, impurity doped diffusion such as boron, phosphorous, and arsenic diffusion through the dielectric layer to the channel is reduced. The control over the interfacial regions between the gate dielectric layer and the gate electrode is improved. The controllability of the nitrogen-to-oxygen atomic gas ratio also results in reduced capacitance versus voltage (CV) hysteresis offset.

In the foregoing specification, the invention has been described with reference to specific embodiments. In particular, the invention has been described in embodiments of semiconductor structures and devices, such as a transistor. The invention is further applicable in embodiments including Non-Volatile Memory (NVM), Dynamic Random Access Memory (DRAM), or Metal-Insulator-Metal capacitors (MIM) for on-chip passives. One of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of the present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A process for forming a semiconductor structure comprising:
   placing a substrate into a chamber, wherein the substrate includes a semiconductor region; and
   physically vapor depositing a dielectric layer that contacts the semiconductor region, wherein:
      depositing includes:
         flowing nitrogen atoms into the chamber at a first nitrogen atomic flow rate at a first time period; and
         flowing nitrogen atoms into the chamber at a second nitrogen atomic flow rate at a second time period after the first time period, wherein the second nitrogen atomic flow rate is substantially different from the first nitrogen atomic flow rate; and
      the dielectric layer includes first metal, oxygen, and nitrogen atoms.

2. The process of claim 1, wherein the first nitrogen atomic flow rate is higher than the second nitrogen atomic flow rate.

3. The process of claim 1, wherein the physically vapor depositing further includes flowing oxygen atoms.

4. The process of claim 1, wherein, during the second time period, a nitrogen-to-oxygen atomic ratio is at least approximately 1:2.

5. The process of claim 4, wherein die dielectric layer has a CV hysteresis offset no greater than approximately 70 milli volts.

6. The process of claim 1, wherein:
   the dielectric layer includes a first portion forming during the first time period, a second portion forming during the second time period, and a third portion formed during a third tune period;
   the first portion contacts the semiconductor region;
   the second portion lies between the first and third portions;
   the first and third portions include metal, silicon, nitrogen, and oxygen atoms; and
   the second portion includes metal, nitrogen, and oxygen atoms and has a substantially lower atomic silicon content compared to the first and third portions.

7. The process of claim 6, further comprising forming a conductive layer contacting the third portion of the dielectric layer, wherein the conductive layer includes a semi conductive element.

8. The process of claim 1, wherein the first metal atoms are selected from a group consisting of Group II elements, Group III elements, and Group V elements.

9. The process of claim 1, wherein the dielectric layer includes second metal atoms that are different from the first metal atoms.

10. The process of claim 1, wherein the dielectric layer includes silicon atoms.

11. The process of claim 1, wherein the dielectric layer has a thickness of at least two nanometers.

* * * * *

UNITED STATES PATENT AND TRADEMARK OFFICE
CERTIFICATE OF CORRECTION

PATENT NO.    : 6,743,668 B2
DATED         : June 1, 2004
INVENTOR(S)   : James K. Schaeffer, III et al.

It is certified that error appears in the above-identified patent and that said Letters Patent is hereby corrected as shown below:

<u>Title page,</u>
Item [62], Related U.S. Application Data, delete "now Pat. No. 6,576,969" and replace with -- now Pat. No. 6,576,967 --

<u>Column 8,</u>
Line 1, delete "die" and replace with -- the --.
Line 5, delete "tune" and replace with -- time --.

Signed and Sealed this

Twelfth Day of July, 2005

JON W. DUDAS
*Director of the United States Patent and Trademark Office*